United States Patent
Mulders

(10) Patent No.: US 7,532,045 B1
(45) Date of Patent: May 12, 2009

(54) LOW-COMPLEXITY ACTIVE TRANSCONDUCTANCE CIRCUIT

(75) Inventor: Adrianus Gerardus Mulders, 's-Hertogenbosch (NL)

(73) Assignee: SiTel Semiconductor B.V. (NL)

( * ) Notice: Subject to any disclaimer, the term of this patent is extended or adjusted under 35 U.S.C. 154(b) by 0 days.

(21) Appl. No.: 11/053,056

(22) Filed: Feb. 8, 2005

(51) Int. Cl.
*H03K 5/00* (2006.01)
*H02M 11/00* (2006.01)

(52) U.S. Cl. ...................... 327/103; 327/552

(58) Field of Classification Search .......... 327/103, 327/551–559
See application file for complete search history.

(56) References Cited

U.S. PATENT DOCUMENTS

| | | | | |
|---|---|---|---|---|
| 5,493,205 A | * | 2/1996 | Gorecki | 323/315 |
| 5,497,123 A | * | 3/1996 | Main et al. | 330/257 |
| 5,644,267 A | * | 7/1997 | Brianti et al. | 327/553 |
| 5,917,368 A | * | 6/1999 | Tan et al. | 327/543 |
| 5,966,046 A | * | 10/1999 | Bezzam et al. | 327/552 |
| 6,346,804 B2 | * | 2/2002 | Ueno et al. | 323/315 |
| 6,680,645 B2 | * | 1/2004 | Greitschus et al. | 327/553 |
| 6,693,467 B2 | * | 2/2004 | Marie | 327/103 |

OTHER PUBLICATIONS

J. J. F. Rijns, "CMOS Low-Distortion High-Frequency Variable-Gain Amplifier", IEEE Journal of Solid-State Circuits, vol. 31, No. 7, Jul. 1996, pp. 1029-1034.
Uma Chilakapati et al., "A CMOS Transconductor with 80-dB SFDR Up to 10 MHz", IEEE Journal of Solid-State Circuits, vol. 37, No. 3, Mar. 2002, pp. 365-370.
Scott D. Willingham et al., "A BiCMOS Low-Distortion 8-MHz Low-Pass Filter", IEEE Journal of Solid-State Circuits, vol. 28, No. 12, Dec. 1993, pp. 1234-1245.

* cited by examiner

*Primary Examiner*—Dinh T. Le

(57) ABSTRACT

An active transconductance is provided by converting an input voltage into a current, and providing the current to a node which is maintained at a generally fixed voltage. Current is mirrored from the fixed voltage node to an output node. Such an active transconductance circuit can meet conventional performance specifications, but at a lower supply current, and/or with lower circuit complexity, and/or with a lower circuit area requirement.

20 Claims, 2 Drawing Sheets

LOW-COMPLEXITY ACTIVE TRANSCONDUCTANCE CIRCUIT

TECHNICAL FIELD OF THE INVENTION

The invention relates generally to active electronic circuits and, more particularly, to active transconductance circuits.

BACKGROUND OF THE INVENTION

Active transconductance circuits are generally characterized by high linearity and high output impedance. These characteristics are desirable at the input of an active RC filter, for example, a radio receiver channel-select filter.

FIG. 1 diagrammatically illustrates an example of a conventional active RC low-pass filter. If the operational amplifier A is assumed to be ideal (infinite DC gain and bandwidth), then the filter response is entirely determined by the resistor ratio ($\alpha$) and the RC product. However, a non-ideal operational amplifier will affect the filter response. For a variable gain implementation, the filter response even depends upon the gain setting.

FIG. 2 diagrammatically illustrates a conventional solution which reduces the non-ideal operational amplifier's impact on the filter response. In FIG. 2, the input resistance R/a of FIG. 1 is replaced by an active input transconductance a/R. The high output impedance of the transconductance eliminates the influence of the resistor R/a on the filter response (see also FIG. 1). Although the non-ideal operational amplifier does affect the filter response in FIG. 2, this is independent of the gain setting of the filter, and the effect is less significant than in the FIG. 1 filter.

Ever increasing cost reductions in integrated circuits require continued migration toward ever smaller sized processes, which operate at ever lower supply voltages. These low supply voltages mean that the circuits must be able to operate with limited headroom. Voltage clipping due to limited headroom is a primary cause of harmonic distortion in active filters.

Although conventional active transconductances have the aforementioned advantages of high linearity and high output impedance, they nevertheless tend to produce harmonic distortion in active filters, to the extent that their behavior is non-linear and the available headroom is limited. Conventional active transconductances are also generally rather complex circuits whose performance relies on good component matching.

SUMMARY OF THE INVENTION

It is desirable in view of the foregoing to provide an active transconductance circuit that can meet conventional performance specifications, but at a lower supply current, and/or with lower circuit complexity, and/or with a lower circuit area requirement.

To address the above-discussed deficiencies of the prior art, it is a primary object of the present invention to provide an active transconductance circuit which, in exemplary embodiments, converts an input voltage into a current, and provides the current to a node that is maintained at a generally fixed voltage. Current is mirrored from the fixed voltage node to an output node. Such an active transconductance circuit is highly linear, has a high output impedance, requires relatively low supply current, relatively low circuit complexity and a relatively small amount of circuit area. Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 7, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged processing system.

Figure 1:
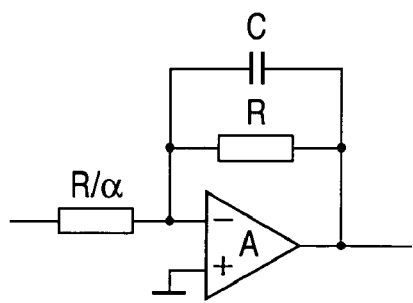
FIG. 1 diagrammatically illustrates an active RC low-pass filter according to the prior art.
Figure 2:
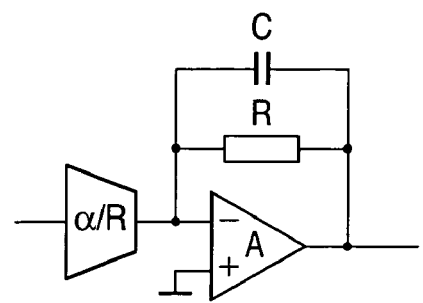
FIG. 2 diagrammatically illustrates an active RC low-pass filter with a transconductor according to the prior art.
Figure 3:
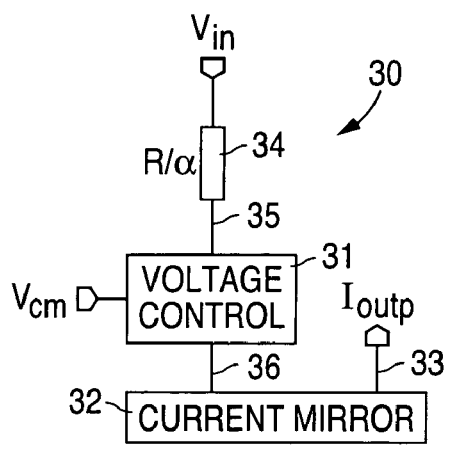
FIG. 3 is a block diagram of a transconductor according to exemplary embodiments of the invention.

FIG. 3 diagrammatically illustrates a transconductor according to exemplary embodiments of the invention. A resistor 34 is applied directly at the voltage input Vin. This resistor 34, having a resistance value of R/$\alpha$ (see also FIGS. 1 and 2) functions as a linear voltage-to-current converter. A voltage control circuit 31 is connected to the resistor 34 at a terminal 35 thereof opposite the voltage input terminal. The voltage control circuit 31 operates to maintain the resistor terminal 35 generally fixed at a common-mode voltage, which can be considered as a virtual ground. The resulting current, designated generally at 36, is essentially entirely determined by the resistor 34. A current mirror 32 mirrors the current at 36 to the output 33. The transconductance circuit 30 has a high output impedance, which can result in an accurate filter response that is independent of the filter gain setting. The voltage control circuit 31 maintains the node 35 generally fixed at a common-mode voltage based on a common-mode reference voltage input, Vcm.

Figure 4:
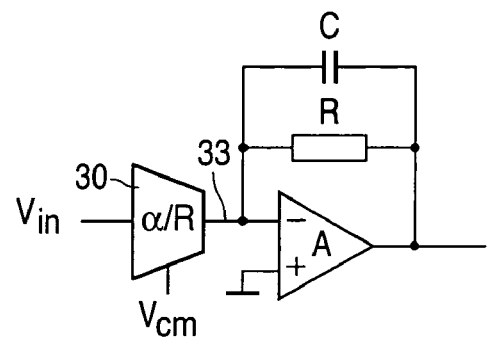
FIG. 4 diagrammatically illustrates an active RC low-pass filter including a transconductance according to exemplary embodiments of the invention.

FIG. 4 diagrammatically illustrates an active RC low-pass filter according to exemplary embodiments of the invention. The filter of FIG. 4 is generally similar to the filter of FIG. 2, but uses the transconductance circuit 30 of FIG. 3, with the output 33 connected to the inverting input of the operational amplifier A. A resistor R and capacitor C are connected in parallel between the inverting input and the output of the operational amplifier A. The non-inverting input of the operational amplifier A is connected to ground potential in the example of FIG. 4. The linear voltage-to-current conversion operation performed by the resistor R/a (see also FIG. 3) provides the filter of FIG. 4 with high linearity. The high output impedance provided by the transconductance circuit 30 provides a highly accurate frequency response.

Figure 5:
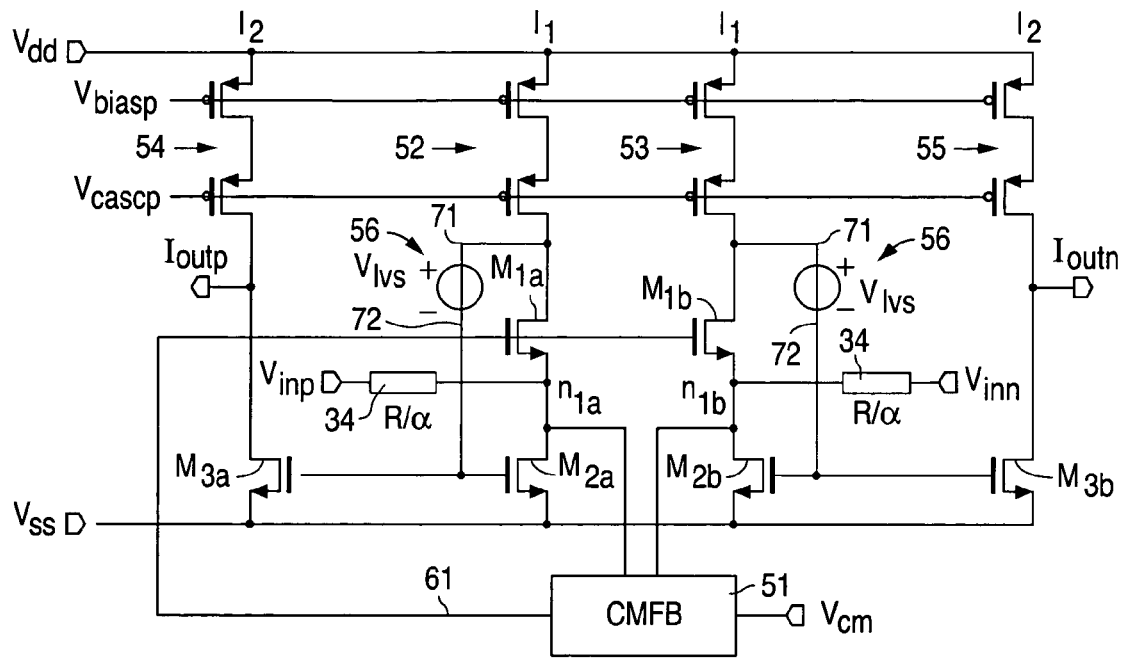
FIG. 5 diagrammatically illustrates a fully-differential transconductance circuit according to exemplary embodiments of the invention.

FIG. 5 diagrammatically illustrates a fully-differential transconductance circuit according to exemplary embodiments of the invention. In FIG. 5, the voltage control circuit 31 of FIG. 3 is implemented by a common-mode feedback (CMFB) circuit 51 together with transistors M1a and M2a. For current mirror operations, current sources at 52 and 53 each provide a generally constant current I1. These current sources 52 and 53 are connected to the respective drains of the transistors M1a and M1b. Also provided are current mirror transistor pairs M2a,M3a and M2b,M3b. The drain of transistor M3a forms the positive component Ioutp of the differential output, and the drain of transistor M3b forms the negative component Ioutn of the differential output. The sources of transistors M1a and M1b are connected to the drains of transistors M2a and M2b, respectively.

For current mirror operations, current sources at 54 and 55 each provide a generally constant current I2 to the drain of a respectively connected one of the transistors M3a and M3b. Bias voltages Vbiasp and Vcascp control the current sources 52-55 according to well-known conventional techniques.

Respective source-drain connections at M1a,M2a and M1b,M2b define fixed voltage nodes n1a and n1b, respectively, where the differential input currents through resistors 34 are added to the constant current I1. The resulting differential current flows through transistors M2a and M2b, and is mirrored by the output transistors M3a and M3b to produce the differential output current at Ioutp and Ioutn. In some embodiments, the transistors within each of the three transistor pairs M1a,M1b, and M2a,M2b, and M3a,M3b are identical in design. In some embodiments, all transistors are MOS transistors.

The voltage-to-current conversion performed by the resistors 34 on the differential input voltages Vinn and Vinp is a linear operation. This results in a highly-linear transconductor circuit. If the current sources 52-55 are assumed to be ideal, then the transconductance of the circuit is determined by the resistance R/a of the resistors 34, and the current ratio N between $(W/L)_3$ and $(W/L)_2$ as follows:

$$G = \frac{\left(\frac{W}{L}\right)_3 / \left(\frac{W}{L}\right)_2}{\frac{2R}{\alpha} + \frac{2g_{o1}(1+g_{o2}R)}{g_{m2}(g_{m1}+g_{o1})}} \approx \frac{\alpha N}{2R} \quad (1)$$

where $(W/L)_3$ represents the width-to-length ratio of the transistors of transistor pair M3a,M3b, and $(W/L)_2$ represents the width-to-length ratio of the transistors of transistor pair M2a, M2b.

The output current Ioutn, Ioutp of the transconductance circuit of FIG. 5 needs to be large enough to obtain the required maximum output voltage at the filter output (see also FIG. 4). Basically, any required output current is achievable by simply scaling the circuit.

The common-mode feedback (CMFB) circuit 51 senses a common-mode voltage associated with nodes n1a and n1b, compares the sensed voltage to a reference voltage, and controls the gates of transistors M1a and M1b to keep nodes n1a and nib at a generally fixed voltage.

The voltage sources Vlvs connected to the drains of transistors M1a and M1b, and further connected to the gates of transistors M2a and M2b, represent level shifters 56 which keep transistors M1a and M1b in saturation.

Figure 6:
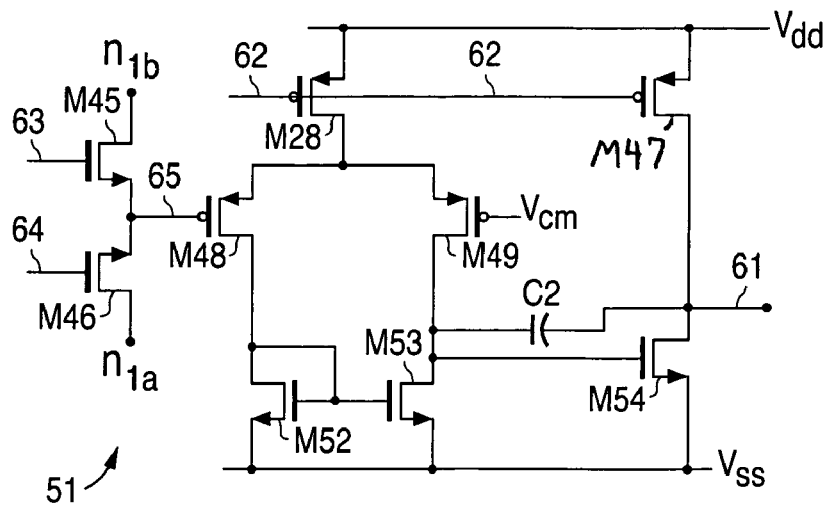
FIG. 6 diagrammatically illustrates a portion of FIG. 5 in more detail according to exemplary embodiments of the invention.

FIG. 6 diagrammatically illustrates the CMFB circuit 51 of FIG. 5 in more detail according to exemplary embodiments of the invention. In FIG. 6, transistors M45 and M46 are biased appropriately by signals 63 and 64 to operate in the linear region, and to therefore act as a resistive voltage divider. Accordingly, the common-mode voltage level associated with nodes n1a and n1b is present at the center tap 65 of the resistive voltage divider. The remainder of the circuitry in FIG. 6, consisting of transistors M28, M47, M48, M49, M52, M53 and M54, together with capacitor C2, all connected as shown, constitutes an operational amplifier circuit which compares the common-mode voltage level at center tap 65 to the reference voltage Vcm. The output 61 of the operational amplifier provides an output signal that drives the gates of transistors M1a and M1b of FIG. 5. The bias voltage 62 controls transistors M28 and M47 according to well-known conventional techniques. In some embodiments, C2=0.5 pF.

Other specific implementations of CMFB circuit 51 can also be used, without constraining performance.

Figure 7:
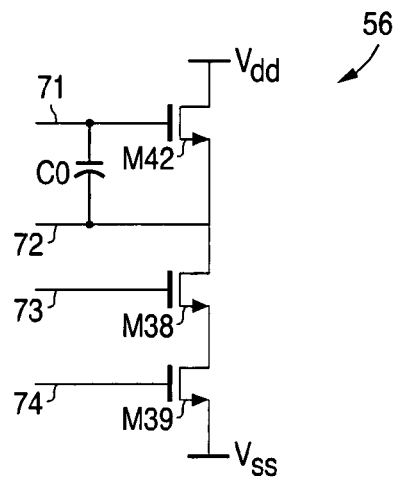
FIG. 7 diagrammatically illustrates a further portion of FIG. 5 in more detail according to exemplary embodiments of the invention.

FIG. 7 diagrammatically illustrates in more detail exemplary embodiments of the level shifters 56 of FIG. 5. As shown in FIG. 7, each level shifter 56 includes transistors M38, M39 and M42 connected in a source follower configuration. The source followers shift the DC levels as illustrated in FIG. 5. The level shifters 56 also include a capacitor C0 connected across the terminals 71 and 72 thereof. In some embodiments, C0=4.5 pF. Bias voltages 73 and 74 control transistors M38 and M39 according to well-known conventional techniques.

Other specific implementations of the level shifters 56 can also be used, without constraining performance.

A mismatch between resistors 34 in the embodiments of FIGS. 5-7 can cause an imbalance between the current through those resistors, thereby causing even-order harmonics that in turn are copied to the outputs. A mismatch between transistors M1a and M1b causes an offset between the virtual grounds at n1a and n1b, thereby causing the same effect as a mismatch between the resistors 34. Because the aforementioned mismatches essentially affect the virtual ground references, and not a relatively large signal voltage, the impact of such mismatches can be expected to be less significant than in conventional transconductor circuits.

Simulations have shown that, with respect to operational specifications such as linearity, filter accuracy over gain range, robustness against component mismatches, and harmonic distortion, transconductance circuits according to the embodiments of FIGS. 3-7 can provide the same operational specifications as conventional transconductor circuits, but with lower circuit complexity, lower circuit area requirements, and lower supply current requirements.

As described above, exemplary embodiments of the invention provide a linear, low-complexity transconductor circuit which is suitable for use in accurate variable-gain filter applications at low supply voltages. Transconductor circuits according to the invention combine high linearity with relatively low circuit complexity and relatively low supply current requirements.

Although the present invention has been described with an exemplary embodiment, various changes and modifications may be suggested to one skilled in the art. It is intended that the present invention encompass such changes and modifications as fall within the scope of the appended claims.

What is claimed is:

1. An active transconductance circuit, comprising:
   an input that receives an input voltage signal for the active transconductance circuit;
   an output;
   a fixed voltage node;
   a voltage-to-current converter having a first end directly connected to said input and a second end directly connected to said fixed voltage node;
   a voltage control circuit having a first end directly connected to said fixed voltage node for maintaining said fixed voltage node at a generally fixed voltage wherein said voltage control circuit has a common mode reference voltage input that receives a common mode reference voltage; and
   a current mirror circuit having a first end directly connected to a second end of said voltage control circuit and having a second end directly connected to said output.

2. The circuit of claim 1, wherein said input is a differential input, and said output is a differential output.

3. The circuit of claim 1, wherein said current mirror circuit includes a current source coupled to said fixed voltage node for providing a generally constant current, first and second transistors having respective gates connected together, and a level shifter connected to said current source and said gates of said first and second transistors.

4. The circuit of claim 3, wherein said level shifter includes a plurality of transistors configured as a source follower.

5. The circuit of claim 1, wherein said voltage-to-current converter is a resistance.

6. The circuit of claim 1, wherein said voltage control circuit includes a compare circuit that compares a voltage associated with said fixed voltage node to a reference voltage, said compare circuit having an output for providing an output signal based on said comparison.

7. The circuit of claim 6, wherein said current mirror circuit includes a current source coupled to said fixed voltage node for providing a generally constant current, and wherein said voltage control circuit includes a transistor having a gate connected to said output of said compare circuit, said transistor having a drain and a source connected in series between said current source and said fixed voltage node.

8. The circuit of claim 7, wherein said voltage control circuit includes a further transistor having a drain and a source connected in series between said fixed voltage node and an input of said compare circuit.

9. The circuit of claim 6, wherein said current mirror circuit includes a current source coupled to said fixed voltage node for providing a generally constant current, first and second transistors having respective gates connected together, and a level shifter connected to said current source and said gates of said first and second transistors.

10. The circuit of claim 6, wherein said compare circuit includes an operational amplifier circuit having a first input for receiving said reference voltage, and having a second input coupled to said fixed voltage node.

11. The circuit of claim 6, wherein said voltage control circuit includes a transistor having a drain and a source connected in series between said fixed voltage node and an input of said compare circuit.

12. The circuit of claim 6, wherein said voltage control circuit includes a resistive voltage divider circuit connected to said fixed voltage node, and wherein said compare circuit has a first input for receiving said reference voltage and a second input connected to a tap within said resistive voltage divider circuit.

13. The circuit of claim 1, wherein said voltage-to-current converter is a resistance, and wherein said transconductance circuit has a transconductance that is a function of said resistance and a current ratio between respective transistors of said current mirror circuit.

14. An active filter circuit, comprising:
    an active circuit component;
    a passive circuit connected to said active circuit component; and
    an active transconductance circuit including an input, an output connected to one of said active circuit component and said passive circuit, a fixed voltage node, a voltage-to-current converter having a first end directly connected to said input and a second end directly connected to said fixed voltage node, a voltage control circuit directly connected to said fixed voltage node for maintaining said fixed voltage node at a generally fixed voltage responsive to a common mode reference voltage received at a common mode input, and a current mirror circuit directly connected to said fixed voltage node and said output.

15. The circuit of claim 14, wherein said passive circuit includes a resistor and a capacitor.

16. The circuit of claim 15, wherein said resistor and said capacitor are connected in parallel with one another and with said active circuit component.

17. The circuit of claim 14, wherein said active circuit component includes an operational amplifier circuit.

18. A method of producing an active transconductance, comprising:
    converting an input voltage signal into a current using a voltage-to-current converter that has a first end directly connected to the input voltage signal and that has a second end directly connected to a fixed voltage node;
    providing said current to the fixed voltage node;
    maintaining said fixed voltage node at a generally fixed voltage using a voltage control circuit having a first end that is directly connected to said fixed voltage node wherein said voltage control circuit has a common mode reference voltage input that receives a common mode reference voltage; and
    mirroring current from said voltage control circuit to an output with a current mirror circuit having a first end directly connected to a second end of said voltage control circuit and having a second end directly connected to said output.

19. The method of claim 18, wherein said maintaining step includes comparing a voltage associated with said node to a reference voltage.

20. The method of claim 19, wherein said maintaining step includes adjusting the voltage at said node based on a result of said comparing step.

* * * * *